US012744495B2

(12) United States Patent
Hedayati et al.

(10) Patent No.: US 12,744,495 B2
(45) Date of Patent: Sep. 22, 2026

(54) TRANSMIT/RECEIVE (TRx) INTERFACE FOR DOHERTY OPERATION

(71) Applicant: QUALCOMM INCORPORATED, San Diego, CA (US)

(72) Inventors: Maziar Hedayati, San Diego, CA (US); Mohammad Javad Asadi, San Diego, CA (US); Chuan Wang, San Diego, CA (US); Chinmaya Mishra, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 276 days.

(21) Appl. No.: 18/732,947

(22) Filed: Jun. 4, 2024

(65) Prior Publication Data

US 2025/0373206 A1 Dec. 4, 2025

(51) Int. Cl.

*H03F 1/02* (2006.01)
*H03F 3/24* (2006.01)
*H04B 1/04* (2006.01)

(52) U.S. Cl.

CPC .......... *H03F 1/0233* (2013.01); *H03F 3/245* (2013.01); *H04B 1/0475* (2013.01); *H03F 2200/294* (2013.01); *H03F 2200/451* (2013.01); *H04B 2001/0408* (2013.01)

(58) Field of Classification Search

CPC .. H03F 1/0233; H03F 3/245; H03F 2200/294; H03F 2200/451; H03F 2200/534; H03F 2200/541; H03F 3/195; H03F 3/211; H03F 1/0288; H03F 1/565; H04B 1/0475; H04B 2001/0408

See application file for complete search history.

(56) References Cited

U.S. PATENT DOCUMENTS

| | | | | |
|---|---|---|---|---|
| 9,312,817 | B2 * | 4/2016 | Aaen | H03F 3/195 |
| 2011/0115565 | A1 * | 5/2011 | Cabanillas | H03F 3/72 330/307 |
| 2023/0091253 | A1 * | 3/2023 | Wang | H03F 1/0288 330/124 R |
| 2023/0361599 | A1 * | 11/2023 | Podhola | H02J 50/10 |
| 2024/0243700 | A1 * | 7/2024 | Shahverdi | H03F 1/56 |
| 2025/0080065 | A1 * | 3/2025 | Sumiyoshi | H03F 3/602 |

FOREIGN PATENT DOCUMENTS

WO WO-2023203859 A1 * 10/2023 ............ H03F 3/245

OTHER PUBLICATIONS

Liu E., et al., "32.9 An Ultra-Compact 28GHz Doherty Power Amplifier with an Asymmetrically-Coupled-Transformer Output Combiner", 2024 IEEE International Solid-State Circuits Conference (ISSCC), Feb. 21, 2024, 3 Pages.

* cited by examiner

*Primary Examiner* — Fayyaz Alam
(74) *Attorney, Agent, or Firm* — Smith Tempel Blaha LLC/ Qualcomm

(57) ABSTRACT

An apparatus includes a main power amplifier (PA) and an auxiliary PA of a Doherty power amplifier coupled to an electromagnetic (EM) structure having a plurality of branches, capacitances selectively coupled to an output of the main PA and to an output of the aux PA, respectively, a low noise amplifier (LNA) coupled to the EM structure, and a port comprising an antenna interface coupled to the EM structure.

20 Claims, 10 Drawing Sheets

TRANSMIT/RECEIVE (TRx) INTERFACE FOR DOHERTY OPERATION

FIELD

The present disclosure relates generally to electronics, and more specifically to radio frequency transceivers using a Doherty power amplifier.

BACKGROUND

Wireless communication devices and technologies are becoming ever more prevalent as are communication systems that operate at millimeter-wave (mmW) and at near-mmW frequencies. Emerging and ongoing 5G and later communication systems generally involve design tradeoffs between the transmit circuitry and the receive circuitry. For example, in a transmit circuit, a Doherty power amplifier has desirable power added efficiency (PAE) at back off power levels, but suffers from large circuit area consumption due to the input and output circuitry associated with the main (carrier) power amplifier (PA) and the auxiliary (peaking) PA. Therefore, it would be desirable to use a Doherty power amplifier and minimize the amount of circuit area used for its implementation.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an apparatus including a main power amplifier (PA) and an auxiliary PA of a Doherty power amplifier coupled to an electromagnetic (EM) structure having a plurality of branches, capacitances selectively coupled to an output of the main PA and to an output of the aux PA, respectively, a low noise amplifier (LNA) coupled to the EM structure, and a port comprising an antenna interface coupled to the EM structure.

Another aspect of the disclosure provides a method for transmission and reception including conveying communication signals between a main power amplifier (PA) and an auxiliary PA of a Doherty power amplifier and an antenna port through an electromagnetic (EM) structure having a plurality of branches, conveying communication signals between a low noise amplifier (LNA) and the antenna port through the EM structure, and selectively coupling capacitances to outputs of the main PA and the auxiliary PA, respectively.

Another aspect of the disclosure provides a device including means for electromagnetically conveying communication signals between a main power amplifier (PA) and an auxiliary PA of a Doherty power amplifier and an antenna port, means for electromagnetically conveying communication signals between a low noise amplifier (LNA) and the antenna, and means for selectively coupling capacitances to outputs of the main PA and the auxiliary PA, respectively.

BRIEF DESCRIPTION OF THE DRAWINGS

In the figures, like reference numerals refer to like parts throughout the various views unless otherwise indicated. For reference numerals with letter character designations such as "102*a*" or "102*b*", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In accordance with an exemplary embodiment, a transmit/receive (TRx) interface for a Doherty power amplifier includes an electromagnetic (EM) structure that minimizes circuit area size.

In accordance with an exemplary embodiment, the EM structure may be rectangular or square in overall shape and may be fabricated to minimize circuit area size.

In accordance with an exemplary embodiment, the transmit/receive (TRx) interface may facilitate efficient coupling of a main PA and an auxiliary PA of a Doherty power amplifier to an antenna connection and may also facilitate efficient coupling of a low noise amplifier (LNA) to the antenna connection.

Figure 1:
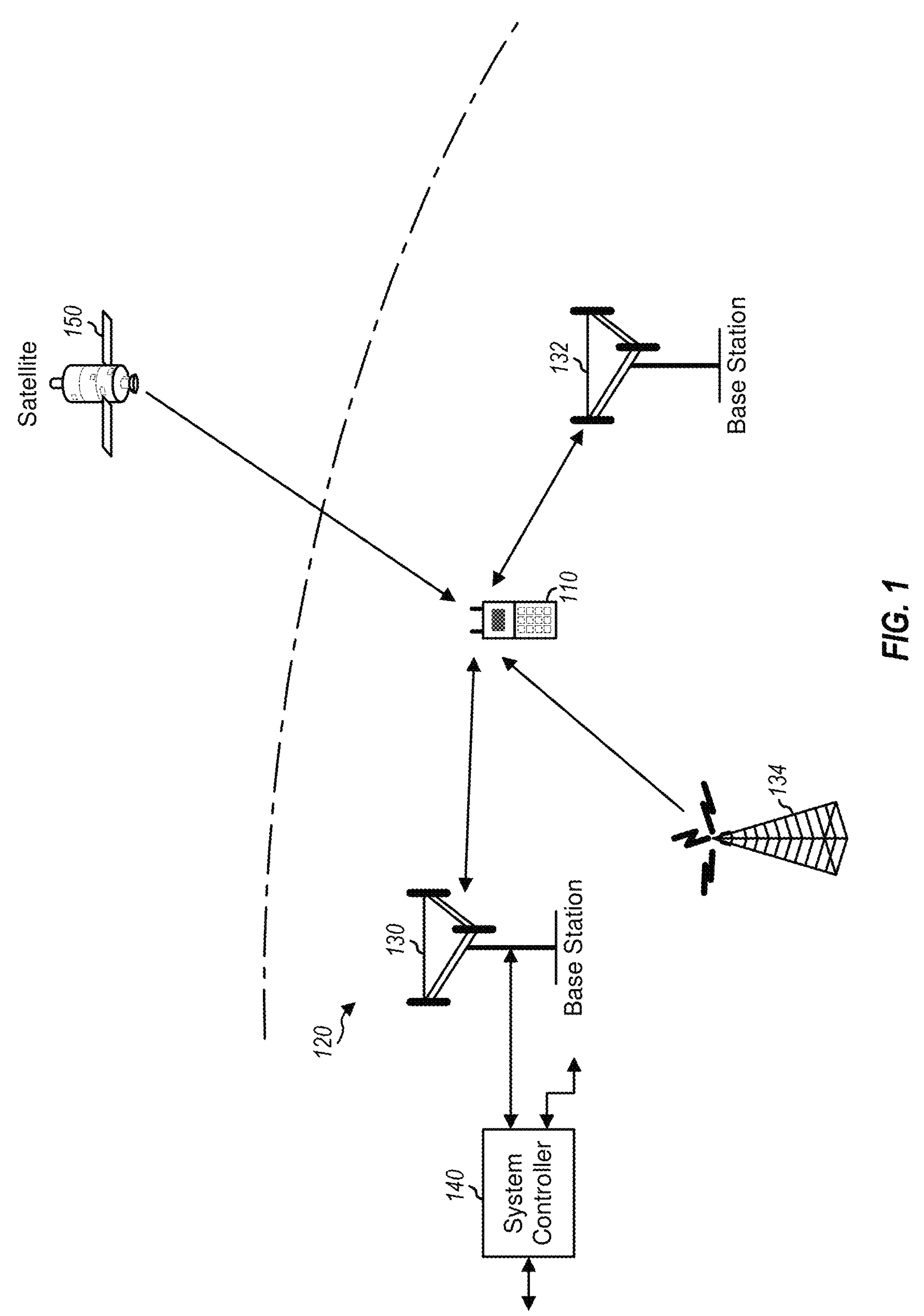
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, an automobile, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134) and/or may communicate with satellites (e.g., a satellite 150 in one or more global navigation satellite systems (GNSS), or a satellite that can receive signals from the wireless device 110, etc.). Wireless device 110 may support one or more radio technologies for wireless communication such as LTE, WCDMA, CDMA 1×, EVDO, TD-SCDMA, GSM, 802.11, 802.15, 5G, Sub6 5G, 6G, UWB, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies. Wireless device 110 may also be capable of communicating directly with other wireless devices without communicating through a network.

In general, carrier aggregation (CA) may be categorized into two types-intra-band CA and inter-band CA. Intra-band CA refers to operation on multiple carriers within the same band. Inter-band CA refers to operation on multiple carriers in different bands.

Figure 2A:
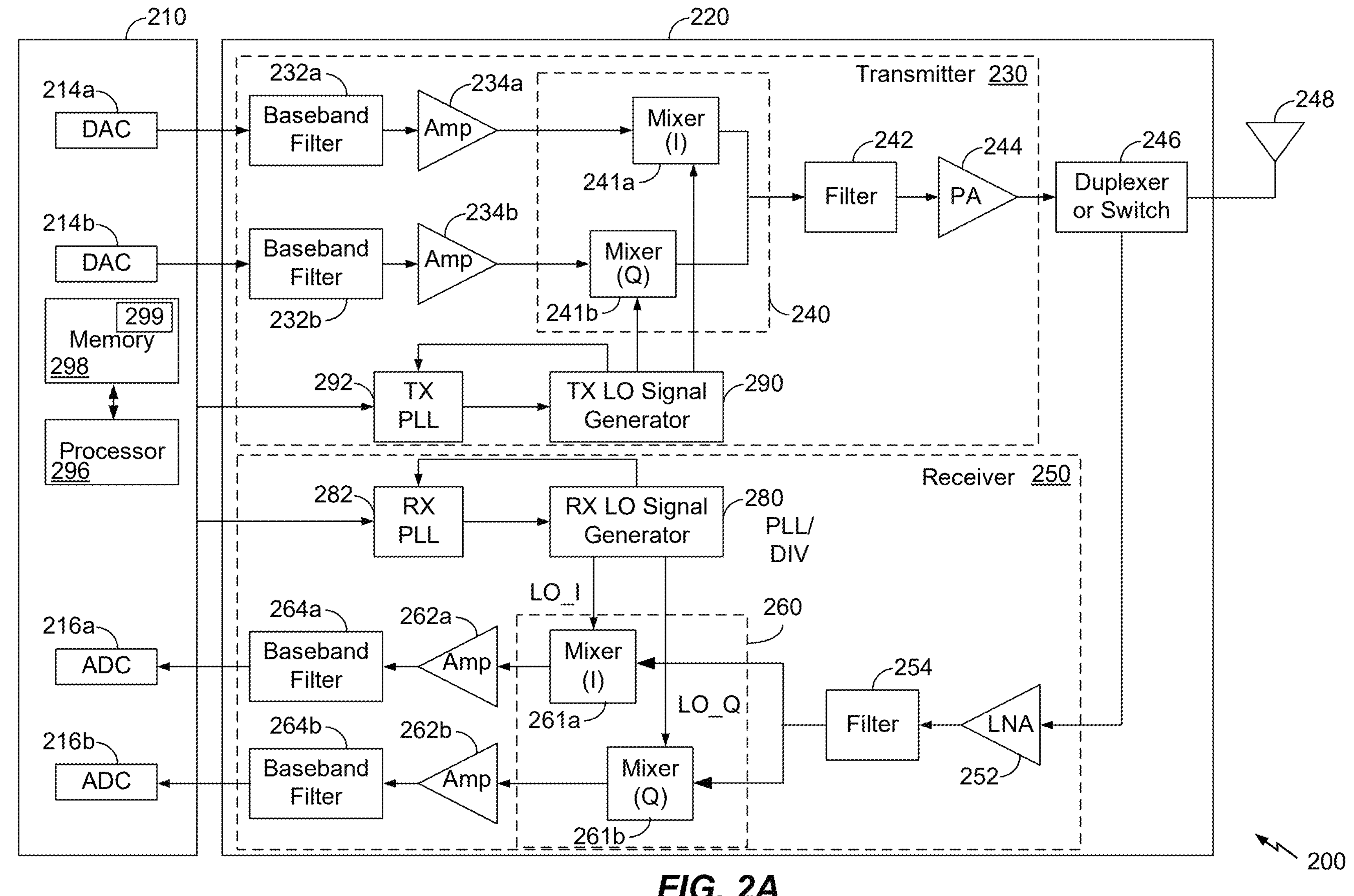
FIG. 2A is a block diagram showing a wireless device in which exemplary techniques of the present disclosure may be implemented.

FIG. 2A is a block diagram showing a wireless device 200 in which exemplary techniques of the present disclosure may be implemented. The wireless device 200 may, for example, be an embodiment of the wireless device 110 illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The processor 296 and the memory 298 may cooperate to control, configure, program, or otherwise fully or partially control some or all of the operation of the embodiments of the pseudo bi-directional amplifier described herein.

The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2A, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214*a* and 214*b* for converting digital signals generated by the data processor 210 into the I and Q analog output signals, e.g., I and Q output currents, for further processing. In other embodiments, the DACs 214*a* and 214*b* are included in the transceiver 220 and the data processor 210 provides data (e.g., for I and Q) to the transceiver 220 digitally.

Within the transmitter 230, baseband (e.g., lowpass) filters 232*a* and 232*b* filter the I and Q analog transmit signals, respectively, to remove undesired images caused by the prior digital-to-analog conversion. Amplifiers (Amp) 234*a* and 234*b* amplify the signals from baseband filters 232*a* and 232*b*, respectively, and provide I and Q baseband signals. An upconverter 240 having upconversion mixers 241*a* and 241*b* upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal may be routed through a duplexer or switch 246 and transmitted via an antenna 248. While examples discussed herein utilize I and Q signals, those of skill in the art will understand that components of the transceiver may be configured to utilize polar modulation.

In the receive path, antenna 248 receives communication signals and provides a received RF signal, which may be routed through duplexer or switch 246 and provided to a low noise amplifier (LNA) 252. The duplexer 246 is designed to operate with a specific RX-to-TX duplexer frequency separation, such that RX signals are isolated from TX signals.

The received RF signal is amplified by LNA 252 and filtered by a filter 254 to obtain a desired RF input signal.

Downconversion mixers 261*a* and 261*b* in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262*a* and 262*b* and further filtered by baseband (e.g., low-pass) filters 264*a* and 264*b* to obtain I and Q analog input signals, which are provided to data processor 210. In the exemplary embodiment shown, the data processor 210 includes analog-to-digital-converters (ADC's) 216*a* and 216*b* for converting the analog input signals into digital signals to be further processed by the data processor 210. In some embodiments, the ADCs 216*a* and 216*b* are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

In an exemplary embodiment in a super-heterodyne architecture, the PA 244 and LNA 252 (and filter 242 and filter 254 in some examples) may be implemented separately from other components in the transmitter 230 and receiver 250, for example on a millimeter wave integrated circuit. An example super-heterodyne architecture is illustrated in FIG. 2B.

Figure 2B:
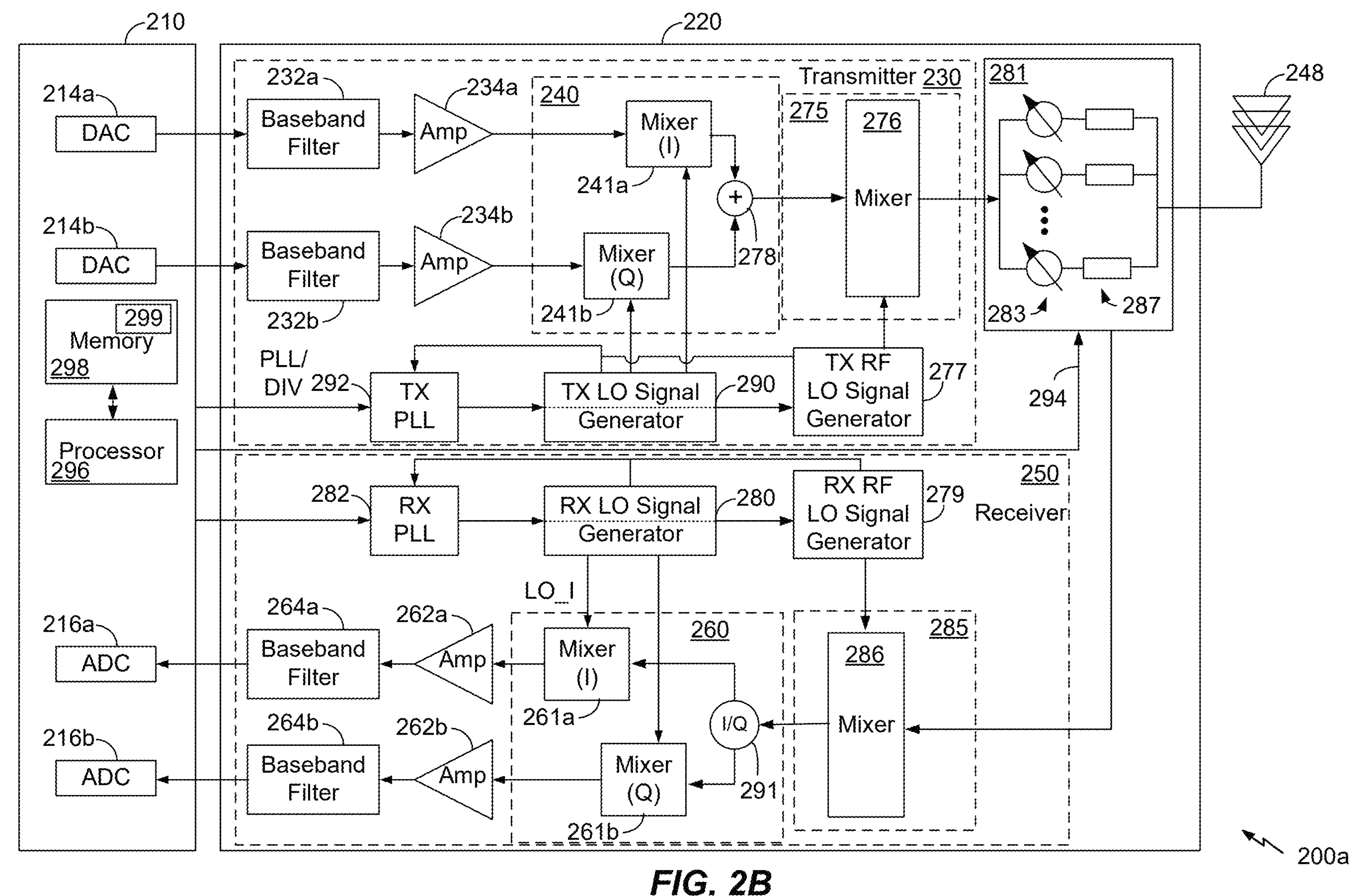
FIG. 2B is a block diagram showing a wireless device in which exemplary techniques of the present disclosure may be implemented.

FIG. 2B is a block diagram showing a wireless device in which exemplary techniques of the present disclosure may be implemented. Certain components, for example which may be indicated by identical reference numerals, of the wireless device 200*a* in FIG. 2B may be configured similarly to those in the wireless device 200 shown in FIG. 2A and the description of identically numbered items in FIG. 2B will not be repeated.

The wireless device 200*a* is an example of a heterodyne (or superheterodyne) architecture in which the upconverter 240 and the downconverter 260 are configured to process a communication signal between baseband and an intermediate frequency (IF). The IF signal may be a low IF (LIF) signal, or a zero (or near zero) IF (ZIF) signal. For example, the upconverter 240 may include a summing function 278 and may be configured to provide an IF signal to an upconverter 275. In an exemplary embodiment, the upconverter 275 may comprise upconversion mixer 276. The summing function 278 combines the I and the Q outputs of the upconverter 240 and provides a non-quadrature signal to the upconversion mixer 276. The non-quadrature signal may be single ended or differential. The upconversion mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2B as being shared by the signal generators 290, 277, a respective PLL for each signal generator may be implemented.

In an exemplary embodiment, components in the phase shift circuitry 281 may comprise one or more adjustable or variable phased array elements, and may receive one or more control signals from the data processor 210 over connection 294 and operate the adjustable or variable phased array elements based on the received control signals.

In an exemplary embodiment, the phase shift circuitry 281 comprises phase shifters 283 and phased array elements 287. Although three phase shifters 283 and three phased array elements 287 are shown for case of illustration, the phase shift circuitry 281 may comprise more or fewer phase shifters 283 and phased array elements 287. For example, one or two arrays of four or five antennas and corresponding phase shifters/phased array elements may be implemented.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, amplifiers, driver amplifiers, and/or power amplifiers. In some embodiments, respective phase shifters 283 may be incorporated within respective phased array elements 287 where each phased array element 287 will include a respective phase shifter 283.

The phase shift circuitry 281 is coupled to an antenna array 248. In an exemplary embodiment, the antenna array 248 comprises a number of antennas that typically correspond to the number of phase shifters 283 and phased array elements 287, for example such that each antenna element is coupled to a respective phased array element 287. In an exemplary embodiment, the phase shift circuitry 281 and the antenna array 248 may be referred to as a phased array.

In a receive direction, an output of the phase shift circuitry 281 is provided to a downconverter 285. In an exemplary embodiment, the downconverter 285 may comprise a downconversion mixer 286. In an exemplary embodiment, the mixer 286 downconverts the receive RF signal provided by the phase shift circuitry 281 to an IF signal according to RX RF LO signals provided by an RX RF LO signal generator 279. The downconverter 260 includes an I/Q generation function 291. The I/Q generation function 291 receives the IF signal from the mixer 286 and generates I and Q signals for the downconverter 260, which downconverts the IF signals to baseband, as described above. While PLL 282 is illustrated in FIG. 2B as being shared by the signal generators 280, 279, a respective PLL for each signal generator may be implemented.

In some embodiments, the upconverter 275, downconverter 285, and the phase shift circuitry 281 are implemented on a common IC. In some embodiments, the summing function 278 and the I/Q generation function 291 are implemented separate from the mixers 276 and 286 such that the mixers 276, 286 and the phase shift circuitry 281 are implemented on the common IC, but the summing function 278 and I/Q generation function 291 are not (e.g., the summing function 278 and I/Q generation function 291 are implemented in another IC coupled to the IC having the mixers 276, 286). In some embodiments, the LO signal generators 277, 279 are included in the common IC. In some embodiments in which phase shift circuitry is implemented on a common IC with 276, 286, 277, 278, 279, and/or 291, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect or both are mounted to a substrate. For example, components of the antenna array 248 may be implemented on a substrate and coupled to an integrated circuit implementing the phase shift circuitry 281 via a flexible printed circuit or the integrated circuit may be mounted to an opposite side of the substrate.

In some embodiments, both the architecture illustrated in FIG. 2A and the architecture illustrated in FIG. 2B are implemented in the same device. For example, a wireless device 110 or 200 may be configured to communicate with signals having a frequency below about 20 GHz using the architecture illustrated in FIG. 2A and to communicate with signals having a frequency above about 20 GHz using the architecture illustrated in FIG. 2B. In devices in which both architectures are implemented, one or more components of FIGS. 2A and 2B that are identically numbered may be shared between the two architectures. For example, both signals that have been downconverted directly to baseband from RF and signals that have been downconverted from RF to baseband via an IF stage may be filtered by the same baseband filter 264. In other embodiments, a first version of the filter 264 is included in the portion of the device which implements the architecture of FIG. 2A and a second version of the filter 264 is included in the portion of the device which implements the architecture of FIG. 2B. While certain example frequencies are described herein, other implementations are possible. For example, signals having a frequency above about 20 GHz (e.g., having a mmW frequency) may be transmitted and/or received using a direct conversion architecture. In such embodiments, for example, a phased array may be implemented in the direct conversion architecture.

Figure 2C:
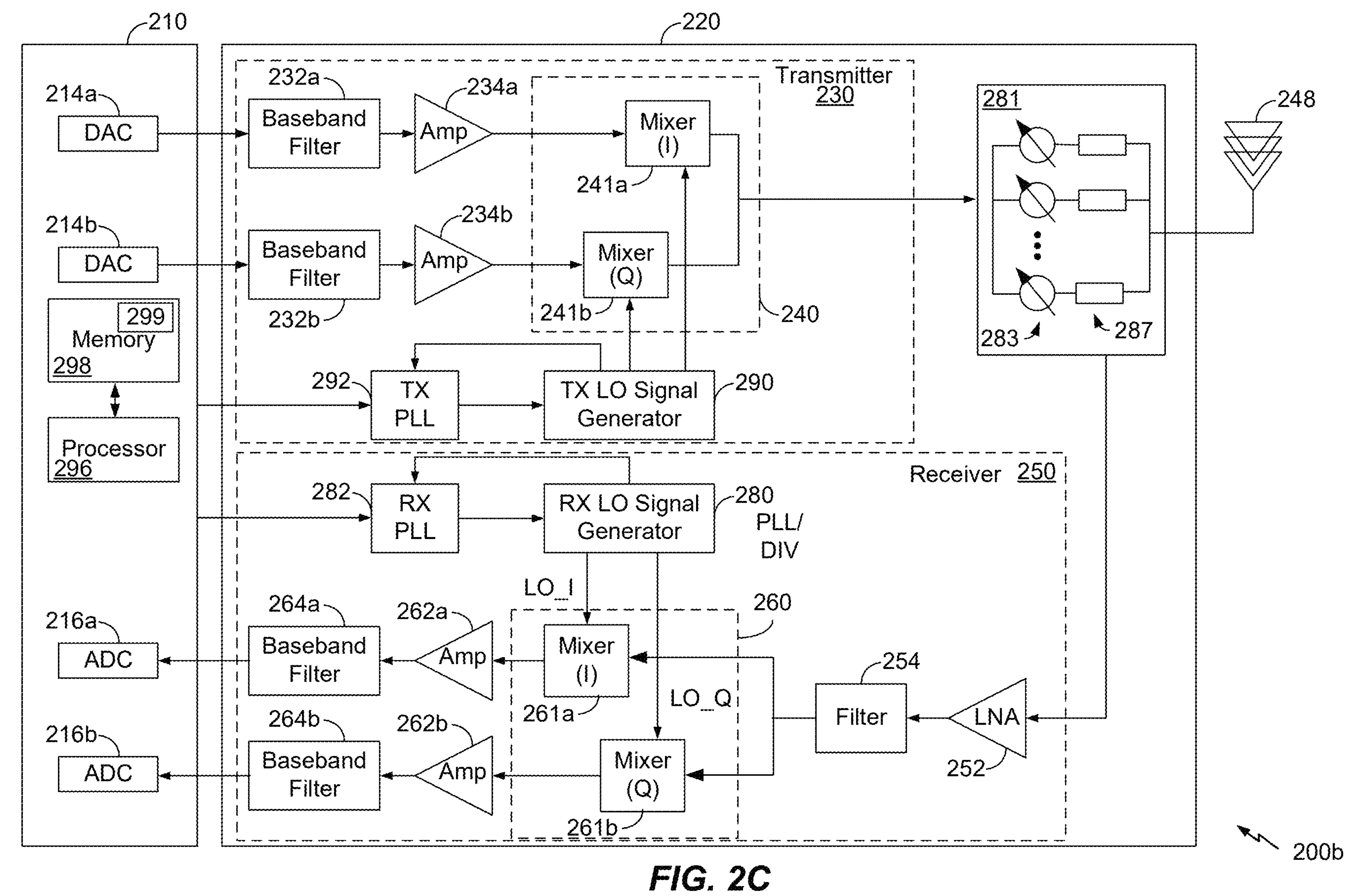
FIG. 2C is a block diagram showing a wireless device in which exemplary techniques of the present disclosure may be implemented.

FIG. 2C is a block diagram showing a wireless device in which exemplary techniques of the present disclosure may be implemented. Certain components, for example which may be indicated by identical reference numerals, of the wireless device 200*b* in FIG. 2C may be configured similarly to those in the wireless device 200 shown in FIG. 2A and/or the wireless device 200*a* shown in FIG. 2B and the description of identically numbered items in FIG. 2C will not be repeated.

The wireless device 200*b* in FIG. 2C incorporates the phase shift circuitry 281 (of FIG. 2B) in a direct conversion architecture, where mmW transmission signals are upconverted and downconverted between baseband and RF without the use of intermediate frequency (IF) signal conversion. For example, the LO signals in the architecture of FIG. 2C may comprise signals at frequencies of tens of GHz.

In some embodiments, the upconverter 240, downconverter 260, and the phase shift circuitry 281 are implemented on a common IC. In some embodiments, the LO signal generators 280, 290 are included in the common IC. In some embodiments, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect or both are mounted to a substrate. For example, components of the antenna array 248 may be implemented on a substrate and coupled to an integrated circuit implementing the phase shift circuitry 281 via a flexible printed circuit or the integrated circuit may be mounted to an opposite side of the substrate.

Figure 3A:
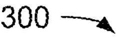
FIG. 3A shows a schematic diagram of a portion of a radio frequency transmit (Tx) receive (Rx) (Tx/Rx) interface circuit.
Figure 3A:
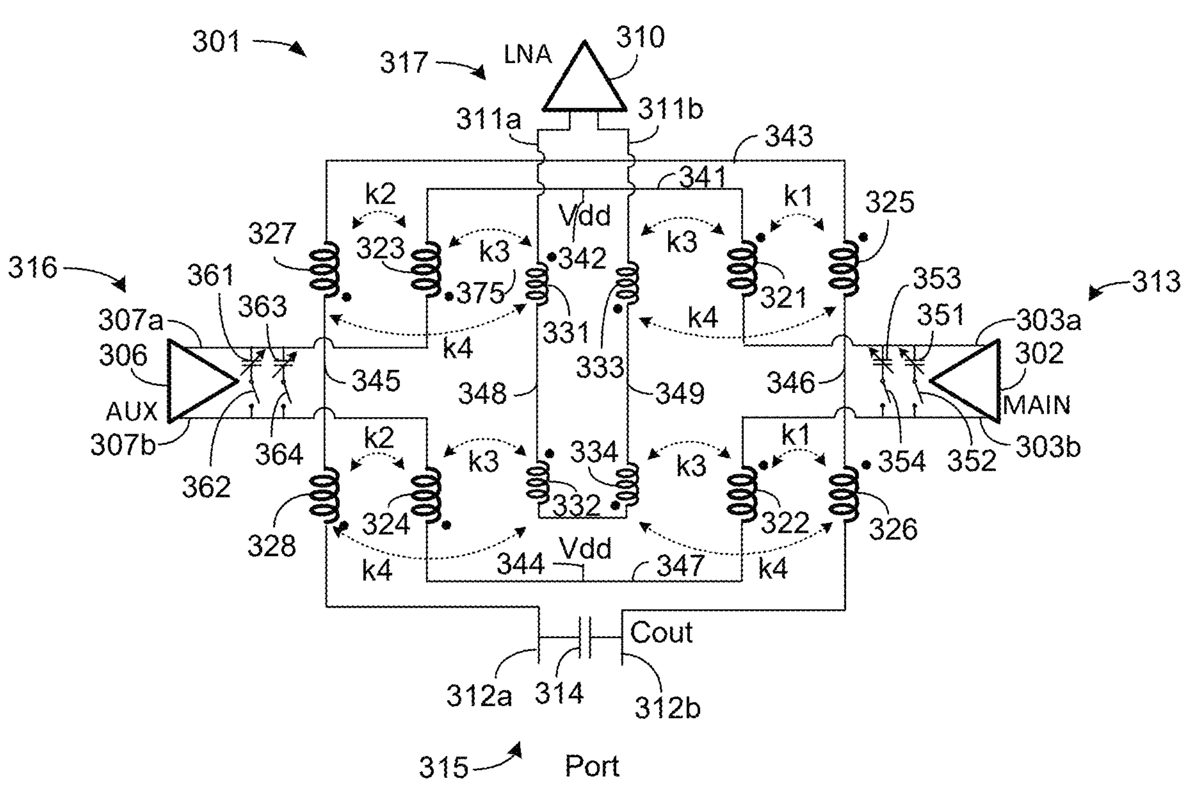

FIG. 3A shows a schematic diagram of a portion of a radio frequency transmit (Tx) receive (Rx) (TRx) interface circuit 300. In an exemplary embodiment, the radio frequency TRx interface circuit 300 may be implemented in or may be associated with the duplexer or switch 246 of FIG. 2A, or may be implemented in or may be associated with the phase shift circuitry 281 of FIG. 2B or FIG. 2C.

In an exemplary embodiment, the interface circuit 300 includes an electromagnetic (EM) structure 310 to which a main power amplifier (PA) 302, an auxiliary PA 306 and a low noise amplifier (LNA) 310 may be connected. In an exemplary embodiment, the main PA 302 and the aux PA 306 may comprise a Doherty power amplifier associated with a transmit circuit. In an exemplary embodiment, the main PA 302 and the aux PA 306 may comprise one or more stages of a power amplifier, such as the power amplifier 244 of FIG. 2A, or a power amplifier associated with or included in one of the phased array elements 287 of FIGS. 2B and 2C. In an exemplary embodiment, the auxiliary PA 306 comprises a peaking amplifier.

In an exemplary embodiment, the LNA 310 may be part of a receive circuit. In an exemplary embodiment, the LNA 310 may be an example of the LNA 252 of FIGS. 2A and 2C, or may be an LNA associated with or included in one of the phased array elements 287 of FIG. 2B. In some such examples, the TRx interface circuit 300 is configured to operate at mmW frequencies. For example, the TRx interface circuit 300 may be configured to operate at frequencies of approximately 24 GHz or higher, such as in the range of 24 GHz to 40 GHz or 24 GHz to 30 GHz.

In an exemplary embodiment, the EM element 301 may comprise a number of inductive elements, such as windings or coils. As used herein, the terms “windings” and “coils” are used to refer to inductive structures that may comprise a variety of shapes and structures including straight structures, curved structures, angular structures, etc. In an exemplary embodiment, the main PA 302 may be connected to windings 321 and 322 over differential connections 303*a* and

303*b* at a port 313 and the aux PA 306 may be connected to windings 323 and 324 over differential connections 307*a* and 307*b* at a port 316.

In an exemplary embodiment, the EM structure 301 may also comprise a port 315 at differential connections 312*a* and 312*b*. The port 315 may comprise an antenna interface. In an exemplary embodiment, depending on antenna configuration, the port 315 may couple to an antenna or a circuit bump (which is connected to an antenna) that may comprise a differential or single ended connection. In the case of a single ended connection, a differential signal at the port 315 may be converted to a single-ended signal by a balun or by another element (not illustrated). In a transmit direction the port 315 may be referred to as a transmit port and in a receive direction, the port 315 may be referred to as a receive port. The port 315 may be connected to an antenna or a circuit bump or pad that may be connected to an antenna or to an antenna array. The port 315 may also be connected to windings 325, 326, 327 and 328.

In an exemplary embodiment, the winding 325 may be connected to the winding 326 over a connection 346, the winding 325 may be connected to the winding 327 over connection 343, and the winding 327 may be connected to the winding 328 over connection 345.

In an exemplary embodiment, the winding 322 may be connected to the winding 324 over connection 347, which includes a connection 344 to a supply voltage, Vdd. Similarly, the winding 321 may be connected to the winding 323 over connection 341, which includes a connection 342 to a supply voltage, Vdd.

In an exemplary embodiment, the LNA 310 may be connected to the winding 331 over differential connection 311*a* and may be connected to the winding 333 over differential connection 311*b* at a port 317. The winding 331 may be connected to the winding 332 over connection 348 and the winding 333 may be connected to the winding 334 over connection 349.

In an exemplary embodiment, a switchable receive (RX) capacitance 351, CmainRX, and a switchable transmit (TX) capacitance 353, CmainTX, may be selectively coupled across the differential connections 303*a* and 303*b* at the output of the main PA 302. The switchable RX capacitance 351 (CmainRX) may be connected to a switch 352 and the switchable TX capacitance (CmainTX) 353 may be connected to a switch 354. In exemplary embodiment, the switches 352 and 354 may be controlled by a control signal from the data processor 210 or another controller. Although shown as selectable by switches 352 and 354, the switchable RX capacitance (CmainRX) 351, and the switchable TX capacitance (CmainTX) 353, may be otherwise controllable to provide a selectable capacitance based on operating mode, such as in transmit mode or in receive mode. Each of the capacitances 351, 353 may be adjustable or fixed.

In an exemplary embodiment, a switchable receive (RX) capacitance 361, CauxRX and a switchable transmit (TX) capacitance 363, CauxTX may be selectively coupled across the differential connections 307*a* and 307*b* at the output of the aux PA 306. The switchable RX capacitance (CauxRX) 361 may be connected to a switch 362 and the switchable TX capacitance (CauxTX) 363 may be connected to a switch 364. In an exemplary embodiment, the switches 362 and 364 may be controlled by a control signal from the data processor 210 or another controller. Although shown as selectable by switches 362 and 364, the switchable RX capacitance (CauxRX) 361, and the switchable TX capacitance (CauxTX) 363, may be otherwise controllable to provide a selectable capacitance based on operating mode, such as in transmit mode or in receive mode. Each of the capacitances 361, 363 may be adjustable or fixed.

A capacitance 314, Cout, may appear across the differential connections 312*a* and 312*b* at the port 315.

In an exemplary embodiment, the capacitances 351, 353, 361 and 363 may be a parasitic capacitance of the main PA 302 and aux PA 306, respectively, may be capacitances external to (or otherwise separate from) the main PA 302 and aux PA 306, or may be a combination of the parasitic capacitance of the main PA 302 and an external capacitance and may be a combination of the parasitic capacitance of the aux PA 306 and an external capacitance.

In an exemplary embodiment, the capacitance 314, Cout, may be a parasitic capacitance of the output port 315, may be a capacitance external to (or otherwise separate from) the output port 315, or may be a combination of the parasitic capacitance of the output port 315 and an external capacitance.

In an exemplary embodiment, in a TX mode, the switches 354 and 364 may be controlled to set the capacitance at the output of the main PA 302 and at the output of the aux PA 306 to generate a 90 degree phase difference between the output of the main PA 302 and the aux PA 306 to enable Doherty operation. For example, in the TX mode, the switches 354 and 364 may be closed. In configurations in which the capacitance 353 and/or 363 is adjustable, the value of the capacitance may be adjusted (e.g., based on a control signal from the data processor 210) to generate the 90 degree phase difference. The 90 degree phase difference between the output of the main PA 302 and the aux PA 306 in this exemplary embodiment may be generated without any additional transmission lines or impedance modification structures. In some examples, the switches 352 and 362 are open during the TX mode.

In an exemplary embodiment, in a RX mode, the main PA 302 is off and the aux PA 306 is off, and the effect of load modulation operation can cause undesirable impedance rotation and therefore cause undesirable peaking in the receive noise figure (NF). To minimize the effect of the load modulation, in RX mode the TX switches 354 and 364 are off (e.g., open), or non-conductive, and the RX switches 352 and 362 are on (e.g., closed), or conductive, causing the capacitance 351 (CmainRX), and the capacitance 361 (CauxRX), to rotate the impedance so that a high impedance condition is created at the input of the LNA 310 in receive mode. In some exemplary embodiments, the capacitance 361 (CauxRX) alone may provide the desired high impedance at the input of the LNA 310. In such embodiments, the switch 352 may be set to an off state or may be omitted (and the capacitor 351 may be omitted) in certain configurations. In configurations in which the capacitance 351 and/or 361 is adjustable, the value of the capacitance may be adjusted (e.g., based on a control signal from the data processor 210) to generate the high impedance condition at the input of the LNA 310.

Figure 3B:
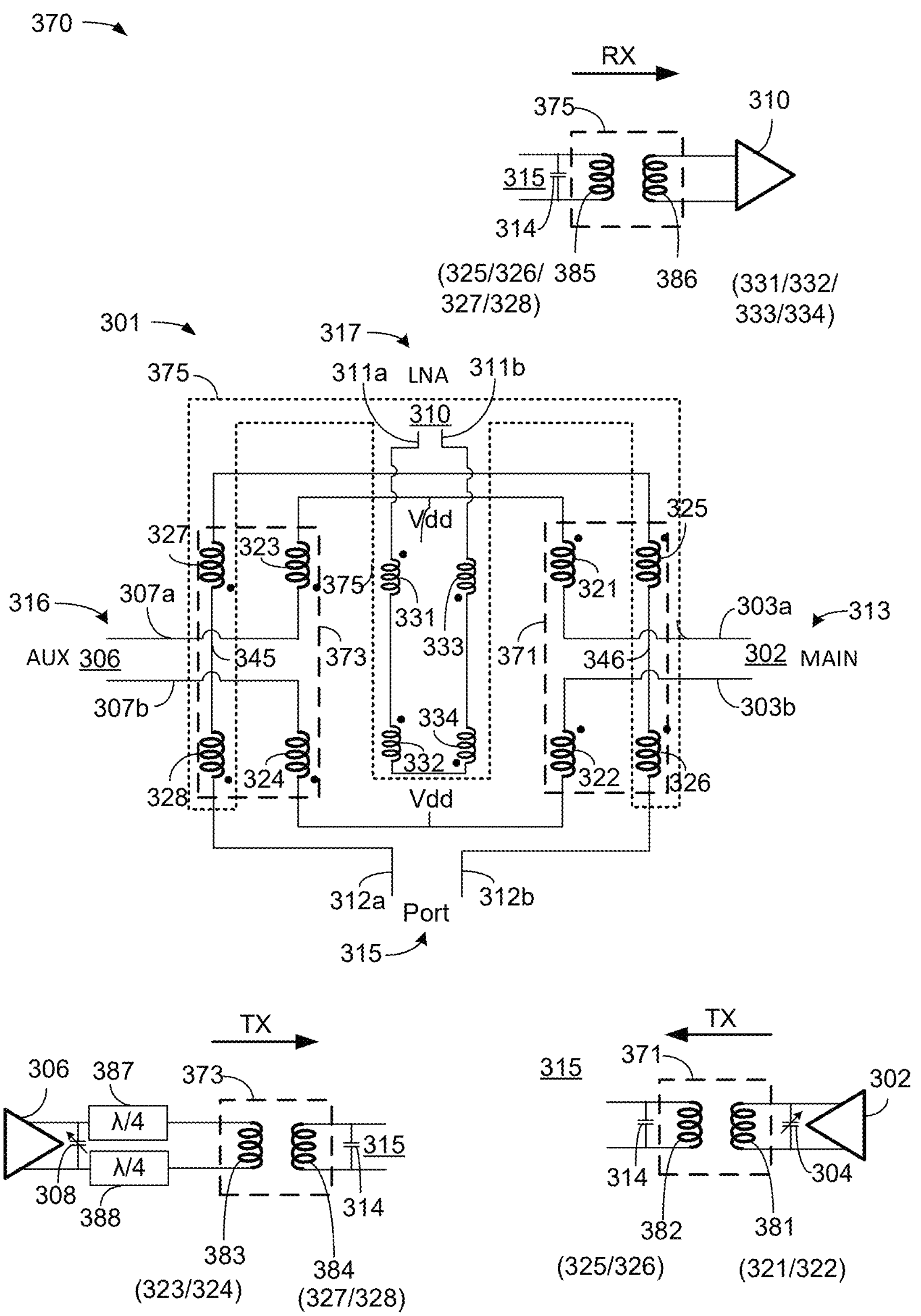
FIG. 3B shows a schematic diagram of transformers associated with the EM structure of FIG. 3A.

FIG. 3B shows a schematic diagram 370 of transformers associated with the EM structure 301 of FIG. 3A. Some of the detail of FIG. 3A has been omitted from FIG. 3B for simplicity of illustration. In an exemplary embodiment, the EM structure 301 may comprise a plurality of transformers. In an exemplary embodiment, the EM structure 301 may comprise three transformers. For example, the windings 321 and 322 may comprise a primary side of a first transformer 371 and the windings 325 and 326 may comprise a secondary side of the first transformer 371.

In an exemplary embodiment, the windings 323 and 324 may comprise a primary side of a second transformer 373 and the windings 327 and 328 may comprise a secondary side of the second transformer 373.

In an exemplary embodiment, the windings 331, 332, 333 and 334 may comprise a primary side of a third transformer 375 and the windings 325, 326, 327 and 328 may comprise a secondary side of the third transformer 375.

In an exemplary embodiment, the transformer 371 may be schematically represented by a primary winding 381 and a secondary winding 382. For example, the primary winding 381 may represent the windings 321 and 322, and the secondary winding 382 may represent the windings 325 and 326.

In an exemplary embodiment, the transformer 373 may be schematically represented by a primary winding 383 and a secondary winding 384. For example, the primary winding 383 may represent the windings 323 and 324, and the secondary winding 384 may represent the windings 327 and 328.

In an exemplary embodiment, the transformer 375 may be schematically represented by a primary winding 385 and a secondary winding 386. For example, the primary winding 385 may represent the windings 325, 326, 327 and 328, and the secondary winding 386 may represent the windings 331, 332, 333 and 334.

In an exemplary embodiment, for ease of illustration, the switchable capacitances 351 (CmainRX) and 353 (CmainTX) may be represented by the capacitance 304 and the switchable capacitances 361 (CauxRX) and 363 (CauxTX) may be represented by the capacitance 308.

In an exemplary embodiment, the transformer 373 may operate in conjunction with the capacitance 308 and the transformer 371 may operate in conjunction with the capacitance 304 to provide a phase shift between the output of the main PA 302 and the output of the aux PA 306, as described above. For example, in an exemplary embodiment, the main PA 302 and the aux PA 306 form a series voltage-combined Doherty power amplifier that preferably exhibits a λ/4 (¼ wavelength, or 90 degree) phase shift between the output of the main PA 302 and the output of the aux PA 306. This λ/4 phase shift between the output of the main PA 302 and the output of the aux PA 306 may be described as an impedance inversion, which in this example is illustrated in the output path of the auxiliary PA 306 using impedance transformation elements 387 and 388. In an exemplary embodiment, the winding 383 in the transformer 373 may operate in conjunction with the capacitance 308 and the winding 381 in the transformer 371 to form this impedance transformation, shown by the impedance elements 387 and 388, without adding any circuit area to the EM structure 301. Thus, while impedance transformation elements 387 and 388 are illustrated in FIG. 3B, these elements may conceptually represent a phase shift in some configurations without requiring a physical element separate from the other illustrated elements to be included or implemented.

Referring again to FIG. 3A and FIG. 3B, in an exemplary embodiment, in a transmit direction an output of the main PA 302 over differential connections 303*a* and 303*b* may be provided from the windings 321 and 322 to the windings 325 and 326, respectively. For example, the windings 321 and 325, and the windings 322 and 326 may be respectively electromagnetically coupled together with a first coupling factor, k1. In an exemplary embodiment, the first coupling factor k1 may be an efficient coupling factor configured to encourage the transfer of signal energy from the windings 321 and 322 to the windings 325 and 326, respectively. In this manner, an output of the main PA 302 may be provided as a signal output to the port 315.

In an exemplary embodiment, in a transmit direction, an output of the aux PA 306 over differential connections 307*a* and 307*b* may be provided from the windings 323 and 324 to the windings 327 and 328, respectively. For example, the windings 323 and 327, and the windings 324 and 328 may be respectively electromagnetically coupled together with a second coupling factor, k2. In an exemplary embodiment, the second coupling factor k2 may be the same or different than the first coupling factor k1, and may be an efficient coupling factor configured to encourage the transfer of signal energy from the windings 323 and 324 to the windings 327 and 328, respectively. In this manner, an output of the aux PA 306 may be provided as a signal output to the port 315.

In an exemplary embodiment, a third coupling factor k3 may exist between the winding 321 and the winding 333, between the winding 322 and the winding 334, between the winding 323 and the winding 331, and between the winding 324 and the winding 332. In an exemplary embodiment, the third coupling factor k3 may be an inefficient coupling factor configured to discourage the transfer of signal energy from the winding 321 to the winding 333, from the winding 322 to the winding 334, from the winding 323 to the winding 331, and from the winding 324 to the winding 332. In this manner, isolation is increased between the main PA 302 and the LNA 310 and between the aux PA 306 and the LNA 310.

In an exemplary embodiment, in a receive direction, a receive signal may be provided as an input from the port 315 to the windings 328 and 326 and to the windings 327 and 325. In an exemplary embodiment, in a receive direction, the winding 326 may electromagnetically couple with the winding 334 and the winding 325 may electromagnetically couple with the winding 333 with a fourth coupling factor, k4. Similarly, in an exemplary embodiment, in a receive direction, the winding 328 may electromagnetically couple with the winding 332 and the winding 327 may electromagnetically couple with the winding 331 with the fourth coupling factor, k4. In an exemplary embodiment, the fourth coupling factor k4 may be an efficient coupling factor configured to encourage the transfer of signal energy from the winding 336 to the winding 334, from the winding 325 to the winding 333, from the winding 328 to the winding 332 and from the winding 327 to the winding 331.

In an exemplary embodiment, the main PA 302 and the aux PA 306 are part of a Doherty power amplifier and are connected to opposite sides of the EM structure 301. The sides of the EM structure 301 to which the main PA 302 and the aux PA 306 are connected are different than the sides of the EM structure 301 to which the LNA 310 and the output port 315 are connected.

Figure 4:
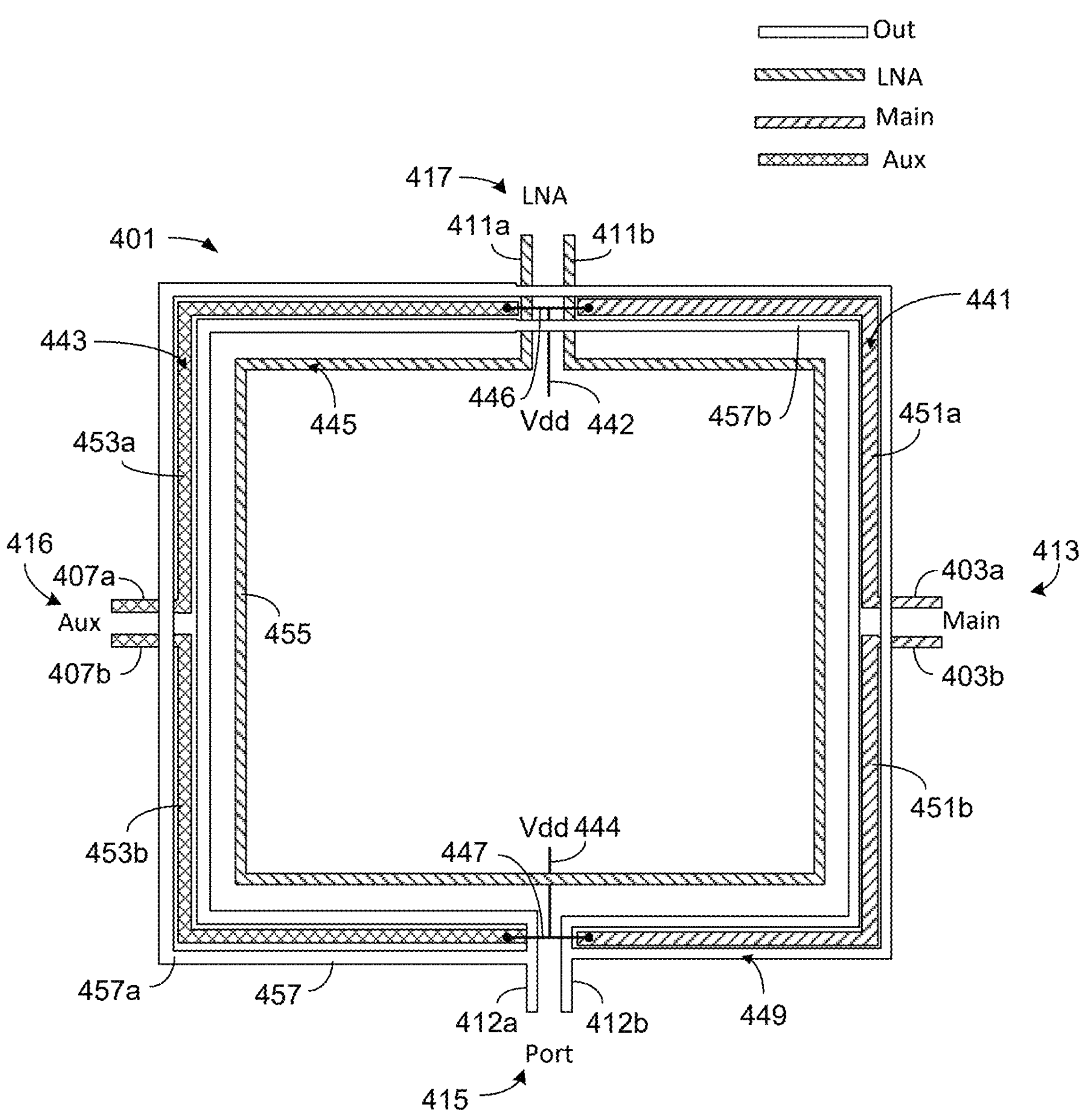
FIG. 4 is a schematic drawing showing an exemplary embodiment of the floorplan layout of the EM structure of FIG. 3A.

FIG. 4 is a schematic drawing showing an exemplary embodiment of the floorplan layout of the EM structure 301 of FIGS. 3A and 3B. In an exemplary embodiment, the EM structure 401 represents portions of the EM structure 301 of FIGS. 3A and 3B. Elements in FIG. 4 that are labeled 4XX are similar to, or correspond to, elements in FIGS. 3A and 3B labeled 3XX.

In FIG. 4, the EM structure 401 includes a first branch 441 having a winding 451*a* that is connected to a connection 403*a* and a winding 451*b* that is connected to a connection 403*b*. In an exemplary embodiment, the winding 451*a* may correspond to the winding 321 of FIGS. 3A/3B and the connection 403*a* may correspond to the differential connection 303*a* of FIGS. 3A/3B. Similarly, in an exemplary embodiment, the winding 451*b* may correspond to the winding 322 of FIGS. 3A/3B and the connection 403*b* may correspond to the differential connection 303*b* of FIGS.

3A/3B. The connections 403*a* and 403*b* may form a port 413 that corresponds to the port 313 of FIGS. 3A/3B. In an exemplary embodiment, the port 413 may be connected to the main PA 302 of FIGS. 3A/3B.

The EM structure 401 also includes a second branch 443 having a winding 453*a* that is connected to a connection 407*a* and a winding 453*b* that is connected to a connection 407*b*. In an exemplary embodiment, the winding 453*a* may correspond to the winding 323 of FIGS. 3A/3B and the connection 407*a* may correspond to the differential connection 307*a* of FIGS. 3A/3B. Similarly, in an exemplary embodiment, the winding 453*b* may correspond to the winding 324 of FIGS. 3A/3B and the connection 407*b* may correspond to the differential connection 307*b* of FIGS. 3A/3B. The connections 407*a* and 407*b* may form a port 416 that corresponds to the port 316 of FIGS. 3A/3B. In an exemplary embodiment, the port 416 may be connected to the aux PA 306 of FIGS. 3A/3B.

In an exemplary embodiment, the winding 451*a* may be connected to the winding 453*a* over a connection 446, which may correspond to the connection 341 in FIG. 3A. In an exemplary embodiment, the connection 446 may be formed from the same material as the windings 451*a* and 453*a* and may be coupled to Vdd by circuit vias, for example. In other embodiments, the connection 446 is not separate from the windings 451*a* and 453*a*, but rather the windings 451*a* and 453*a* are continually connected together on the same layer. A connection 442 to a supply voltage, Vdd may correspond to the connection 342 in FIG. 3A. Similarly, in an exemplary embodiment, the winding 451*b* may be connected to the winding 453*b* over a connection 447, which may correspond to the connection 347 in FIG. 3A. In an exemplary embodiment, the connection 447 may be formed from the same material as the windings 451*b* and 453*b* and may be coupled to Vdd by circuit vias, for example. A connection 444 to a supply voltage, Vdd may correspond to the connection 344 in FIG. 3A.

The EM structure 401 also includes a third branch 445 having a winding 455 that is connected to a connection 411*a* and a connection 411*b*. In an exemplary embodiment, the winding 455 may correspond to the windings 331, 332, 333 and 334 and to the connections 348 and 349 of FIG. 3A. The connections 411*a* and 411*b* may form a port 417 that corresponds to the port 317 of FIGS. 3A/3B. In an exemplary embodiment, the port 417 may be connected to the LNA 310 of FIGS. 3A/3B.

The EM structure 401 also includes a fourth branch 449 having a winding 457 that is connected to a connection 412*a* and a connection 412*b*. In some examples, the winding 457 includes two portions, 457*a* and 457*b*, which surround (e.g., enclose in the footprint view illustrated in FIG. 4) the first branch 441. For example, the portion 457*b* may be concentrically disposed with respect to the first branch 441 and closer to a center of the EM structure 401 than the first branch 441. Similarly, the portion 457*a* may be concentrically disposed with respect to the first branch 441 and further from a center of the EM structure 401 than the first branch 441. In an exemplary embodiment, the winding 457 may correspond to the windings 327, 328, 325 and 326 and to the connections 345, 343 and 346 of FIG. 3A. The connections 412*a* and 412*b* may form a port 415 that corresponds to the port 315 of FIGS. 3A/3B. One or more of the first branch 441, the second branch 443, the third branch 445, and the fourth branch 449 may be on the same layer(s). In other examples, all of the first branch 441, the second branch 443, the third branch 445, and the fourth branch 449 are wholly or partially disposed on separate layers.

Figure 5:
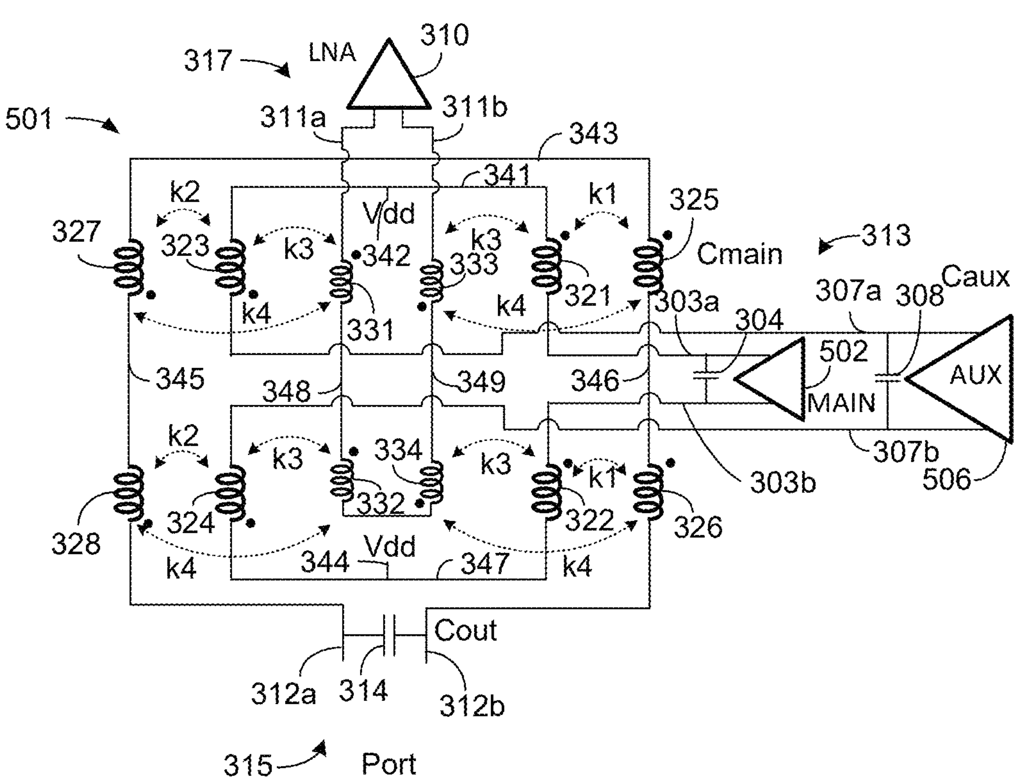
FIG. 5 is a schematic drawing showing a schematic diagram of an alternative exemplary embodiment of the portion of the radio frequency transmit (Tx) receive (Rx) (Tx/Rx) interface circuit of FIG. 3A.

FIG. 5 is a schematic drawing showing a schematic diagram of an alternative exemplary embodiment of the portion of the radio frequency transmit (Tx) receive (Rx) (TRx) interface circuit 300 of FIG. 3A. In an exemplary embodiment, the EM structure 501 is similar to the EM structure 301 of FIG. 3A. Elements in FIG. 5 that are labeled 5XX are similar to, or correspond to, elements in FIG. 3A labeled 3XX.

In FIG. 5, the main PA 502 and the aux PA 506 are part of a Doherty power amplifier and are connected to the same side of the EM structure 501, which is different than the sides of the EM structure 501 to which the LNA 310 and the output port 315 of FIG. 5 are connected.

Figure 6:
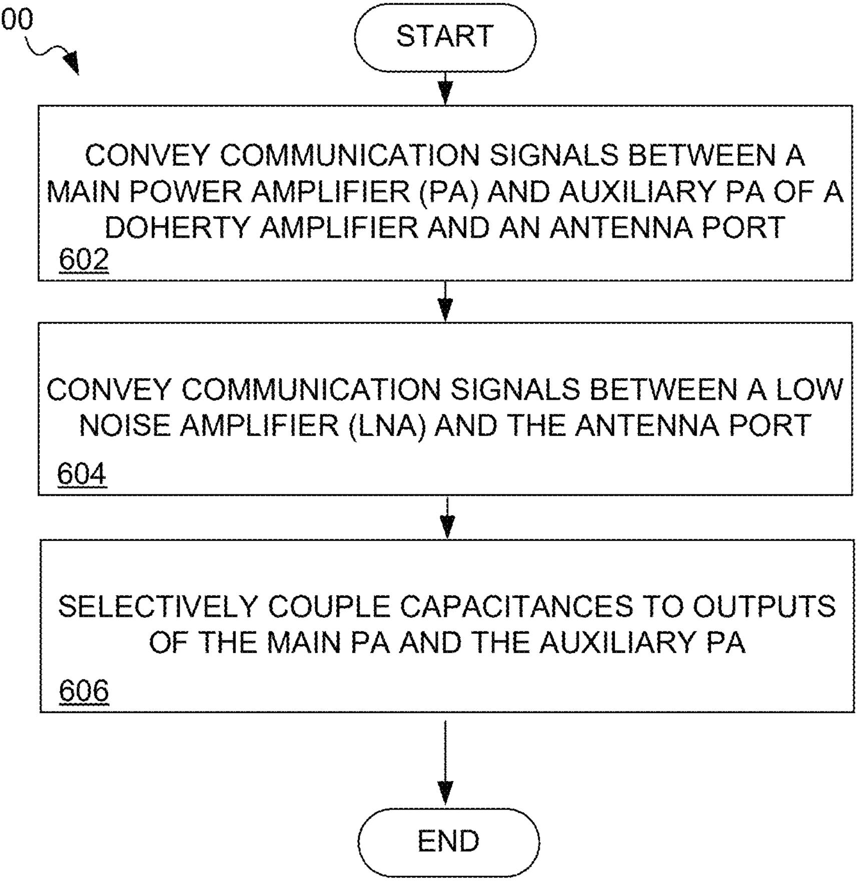
FIG. 6 is a flow chart describing an example of the operation of a method for transmission and reception.

FIG. 6 is a flow chart 600 describing an example of the operation of a method for transmission and reception. The blocks in the method 600 can be performed in or out of the order shown, and in some embodiments, can be performed at least in part in parallel.

In block 602, communication (e.g., mmW) signals are electromagnetically conveyed between a main power amplifier (PA) and an auxiliary PA of a Doherty PA and an antenna port. For example, the main PA 302 may be connected to the port 315 using windings 321/325 and windings 322/326; and the aux PA 306 may be connected to the port 315 using the windings 323/327 and 324/328.

In block 604, communication (e.g., mmW) signals are electromagnetically conveyed between a low noise amplifier (LNA) and the antenna port. For example, the LNA 310 may be connected to the port 315 using windings 321/325 and windings 322/326; and the aux PA 306 may be connected to the port 315 using the windings 331/327, 332/328, 333/325 and 334/326.

In block 606, capacitances are selectively coupled to outputs of the main PA and the auxiliary PA, respectively. For example, the capacitances 351, 353, 361, 363 are selectively coupled to outputs of the main PA 302 and the aux PA 306.

Figure 7:
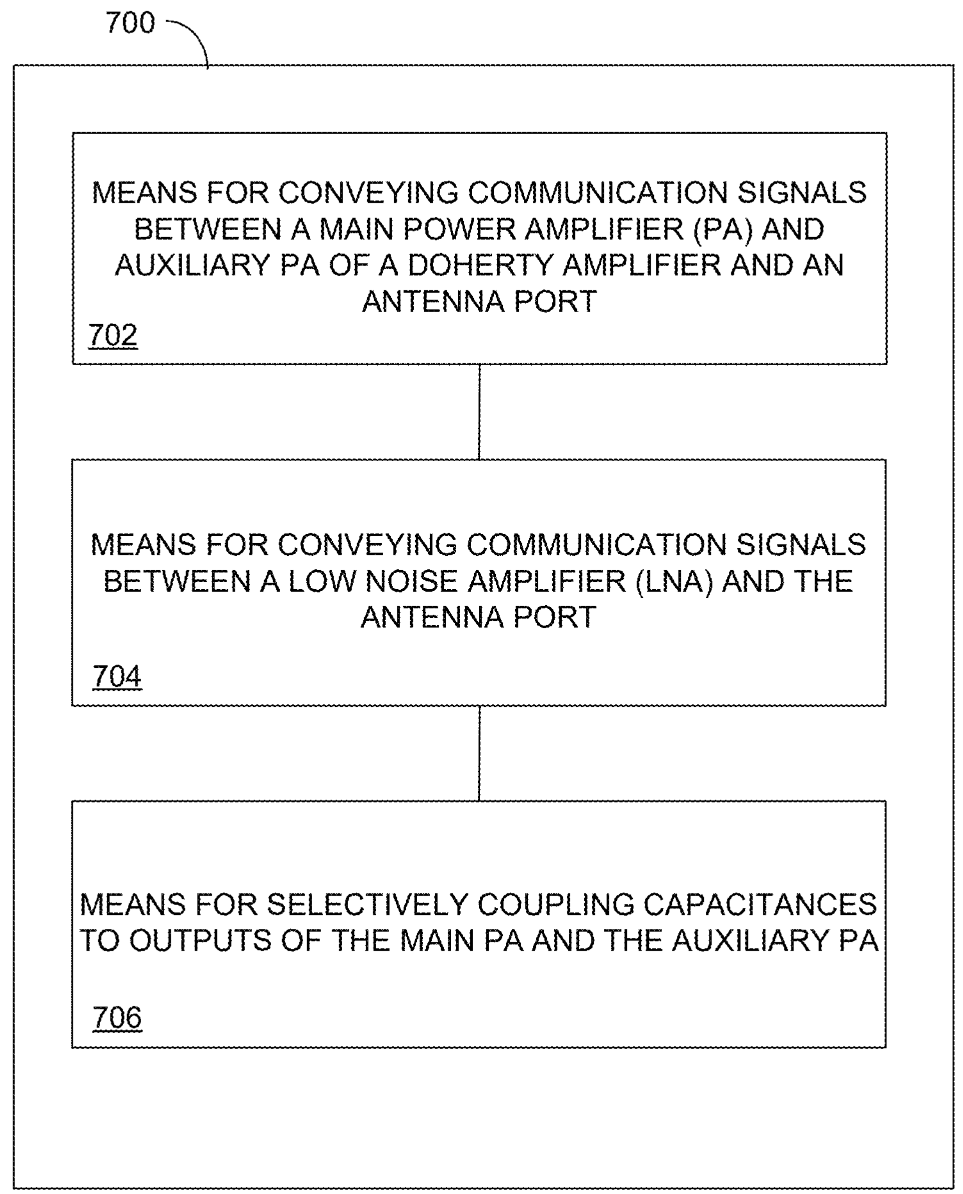
FIG. 7 is a functional block diagram of an apparatus for transmission and reception.

FIG. 7 is a functional block diagram of an apparatus 700 for transmission and reception. The apparatus 700 comprises means 702 for electromagnetically conveying (e.g., mmW) communication signals between a main power amplifier (PA) and an auxiliary PA of a Doherty PA and an antenna port. In certain embodiments, the means 702 can be configured to perform one or more of the functions described in operation block 602 of method 600 (FIG. 6). In an exemplary embodiment, the means 702 may comprise the windings 321/325 and windings 322/326; and the windings 323/327 and 324/328.

The apparatus 700 also comprises means 704 for electromagnetically conveying (e.g., mmW) signals between a low noise amplifier (LNA) and the antenna port. In certain embodiments, the means 704 can be configured to perform one or more of the functions described in operation block 604 of method 600 (FIG. 6). In an exemplary embodiment, the means 704 may comprise the windings 321/325 and windings 322/326; and the windings 331/327, 332/328, 333/325 and 334/326.

The apparatus 700 further comprises means 706 for selectively coupling capacitances to outputs of the main PA and the auxiliary PA, respectively. In certain embodiments, the means 706 can be configured to perform one or more of the functions described in operation block 606 of method 600 (FIG. 6). In an exemplary embodiment, the means 706 may comprise the switches 352, 354, 362, 364 and/or the data processor 210.

Implementation examples are described in the following numbered clauses:

1. An apparatus, comprising: a main power amplifier (PA) and an auxiliary PA of a Doherty power amplifier coupled to an electromagnetic (EM) structure having a plurality of branches; capacitances selectively coupled to an output of the main PA and to an output of the aux PA, respectively; a low noise amplifier (LNA) coupled to the EM structure; and a port comprising an antenna interface coupled to the EM structure.
2. The apparatus of clause 1, wherein the EM structure further comprises: a first branch having a first winding and a second winding connected to a first port; a second branch having a third winding and a fourth winding connected to a second port; a third branch having a fifth winding, a sixth winding, a seventh winding and an eighth winding; and a fourth branch having a ninth winding, a tenth winding, an eleventh winding and a twelfth winding.
3. The apparatus of clause 1 or clause 2, wherein the EM structure comprises at least four branches, the four branches being arranged in a rectangle.
4. The apparatus of any of clauses 1 through 3, wherein the LNA and the port are connected on opposite sides of the EM structure.
5. The apparatus of any of clauses 1 through 4, wherein the main PA and the aux PA are connected to opposite sides of the EM structure that are different than the sides of the EM structure to which the LNA and the port are connected.
6. The apparatus of any of clauses 1 through 4, wherein the main PA and the aux PA are connected to the same side of the EM structure, the same side being different than the sides of the EM structure to which the LNA and the output port are connected.
7. The apparatus of clause 2, wherein: the first winding and the ninth winding are electromagnetically coupled using a first coupling factor (k1); and the second winding and the tenth winding are electromagnetically coupled using the first coupling factor (k1).
8. The apparatus of clause 7, wherein: the third winding and the eleventh winding are electromagnetically coupled using a second coupling factor (k2); and the fourth winding and the twelfth winding are electromagnetically coupled using the second coupling factor (k2).
9. The apparatus of clause 8, wherein: the third winding and the fifth winding are electromagnetically coupled using a third coupling factor (k3); the fourth winding and the sixth winding are electromagnetically coupled using the third coupling factor (k3); the seventh winding and the first winding are electromagnetically coupled using the third coupling factor (k3); and the eighth winding and the second winding are electromagnetically coupled using the third coupling factor (k3), wherein the third coupling factor (k3) is less efficient than the first coupling factor (k1) and the second coupling factor (k2).
10. The apparatus of clause 2, wherein: the fifth winding and the eleventh winding are electromagnetically coupled using a fourth coupling factor (k4); the sixth winding and the twelfth winding are electromagnetically coupled using the fourth coupling factor (k4); the seventh winding and the ninth winding are electromagnetically coupled using the fourth coupling factor (k4); and the eighth winding and the tenth winding are electromagnetically coupled using the fourth coupling factor (k4).
11. The apparatus of any of clauses 1 through 10, wherein the outputs of the main PA and the auxiliary PA are differential, and wherein the capacitances comprise a first capacitor coupled by a first switch across the differential outputs of the main PA, a second capacitor coupled by a second switch across the differential outputs of the auxiliary PA, and a third capacitor coupled by a third switch across the differential outputs of the auxiliary PA.
12. The apparatus of clause 11, wherein the first capacitor, the second capacitor, or the third capacitor is adjustable.
13. The apparatus of clause 11, further comprising a fourth capacitor coupled by a fourth switch across the differential outputs of the main PA.
14. A method for transmission and reception, comprising: conveying communication signals between a main power amplifier (PA) and an auxiliary PA of a Doherty power amplifier and an antenna port through an electromagnetic (EM) structure having a plurality of branches; conveying communication signals between a low noise amplifier (LNA) and the antenna port through the EM structure; and selectively coupling capacitances to outputs of the main PA and the auxiliary PA, respectively.
15. The method of clause 14, wherein the EM structure comprises at least four branches, the four branches being arranged in a rectangle.
16. The method of clause 14, wherein the main PA and the antenna port are coupled through the EM structure by a first coupling factor (k1).
17. The method of clause 16, wherein the auxiliary PA and the antenna port are coupled through the EM structure by a second coupling factor (k2).
18. The method of clause 17, wherein the LNA and the antenna port are coupled through the EM structure by a fourth coupling factor (k4).
19. The method of any of clauses 14 through 18, wherein the selectively coupling comprises coupling a first capacitor across differential outputs of the main PA and coupling a second capacitor across differential outputs of the auxiliary PA during a transmit mode, and coupling a third capacitor across the differential outputs of the auxiliary PA during a receive mode.
20. A device, comprising: means for electromagnetically conveying communication signals between a main power amplifier (PA) and an auxiliary PA of a Doherty power amplifier and an antenna port; means for electromagnetically conveying communication signals between a low noise amplifier (LNA) and the antenna; and means for selectively coupling capacitances to outputs of the main PA and the auxiliary PA, respectively.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. An apparatus, comprising:
- a main power amplifier (PA) and an auxiliary PA of a Doherty power amplifier coupled to an electromagnetic (EM) structure having a plurality of branches;
- capacitances selectively coupled to an output of the main PA and to an output of the aux PA, respectively;
- a low noise amplifier (LNA) coupled to the EM structure; and
- a port comprising an antenna interface coupled to the EM structure.

2. The apparatus of claim 1, wherein the EM structure further comprises:
- a first branch having a first winding and a second winding connected to a first port;
- a second branch having a third winding and a fourth winding connected to a second port;
- a third branch having a fifth winding, a sixth winding, a seventh winding and an eighth winding; and
- a fourth branch having a ninth winding, a tenth winding, an eleventh winding and a twelfth winding.

3. The apparatus of claim 1, wherein the EM structure comprises at least four branches, the four branches being arranged in a rectangle.

4. The apparatus of claim 1, wherein the LNA and the port are connected on opposite sides of the EM structure.

5. The apparatus of claim 4, wherein the main PA and the aux PA are connected to opposite sides of the EM structure that are different than the sides of the EM structure to which the LNA and the port are connected.

6. The apparatus of claim 4, wherein the main PA and the aux PA are connected to the same side of the EM structure, the same side being different than the sides of the EM structure to which the LNA and the output port are connected.

7. The apparatus of claim 2, wherein:
- the first winding and the ninth winding are electromagnetically coupled using a first coupling factor (k1); and
- the second winding and the tenth winding are electromagnetically coupled using the first coupling factor (k1).

8. The apparatus of claim 7, wherein:
- the third winding and the eleventh winding are electromagnetically coupled using a second coupling factor (k2); and
- the fourth winding and the twelfth winding are electromagnetically coupled using the second coupling factor (k2).

9. The apparatus of claim 8, wherein:
- the third winding and the fifth winding are electromagnetically coupled using a third coupling factor (k3);
- the fourth winding and the sixth winding are electromagnetically coupled using the third coupling factor (k3);
- the seventh winding and the first winding are electromagnetically coupled using the third coupling factor (k3); and
- the eighth winding and the second winding are electromagnetically coupled using the third coupling factor (k3), wherein the third coupling factor (k3) is less efficient than the first coupling factor (k1) and the second coupling factor (k2).

10. The apparatus of claim 2, wherein:
- the fifth winding and the eleventh winding are electromagnetically coupled using a fourth coupling factor (k4);
- the sixth winding and the twelfth winding are electromagnetically coupled using the fourth coupling factor (k4);
- the seventh winding and the ninth winding are electromagnetically coupled using the fourth coupling factor (k4); and
- the eighth winding and the tenth winding are electromagnetically coupled using the fourth coupling factor (k4).

11. The apparatus of claim 1, wherein the outputs of the main PA and the auxiliary PA are differential, and wherein the capacitances comprise a first capacitor coupled by a first switch across the differential outputs of the main PA, a second capacitor coupled by a second switch across the differential outputs of the auxiliary PA, and a third capacitor coupled by a third switch across the differential outputs of the auxiliary PA.

12. The apparatus of claim 11, wherein the first capacitor, the second capacitor, or the third capacitor is adjustable.

13. The apparatus of claim 11, further comprising a fourth capacitor coupled by a fourth switch across the differential outputs of the main PA.

14. A method for transmission and reception, comprising:
- conveying communication signals between a main power amplifier (PA) and an auxiliary PA of a Doherty power amplifier and an antenna port through an electromagnetic (EM) structure having a plurality of branches;
- conveying communication signals between a low noise amplifier (LNA) and the antenna port through the EM structure; and
- selectively coupling capacitances to outputs of the main PA and the auxiliary PA, respectively.

15. The method of claim 14, wherein the EM structure comprises at least four branches, the four branches being arranged in a rectangle.

16. The method of claim 14, wherein the main PA and the antenna port are coupled through the EM structure by a first coupling factor (k1).

17. The method of claim 16, wherein the auxiliary PA and the antenna port are coupled through the EM structure by a second coupling factor (k2).

18. The method of claim 17, wherein the LNA and the antenna port are coupled through the EM structure by a fourth coupling factor (k4).

19. The method of claim 14, wherein the selectively coupling comprises coupling a first capacitor across differential outputs of the main PA and coupling a second capacitor across differential outputs of the auxiliary PA during a transmit mode, and coupling a third capacitor across the differential outputs of the auxiliary PA during a receive mode.

20. A device, comprising:
- means for electromagnetically conveying communication signals between a main power amplifier (PA) and an auxiliary PA of a Doherty power amplifier and an antenna port;
- means for electromagnetically conveying communication signals between a low noise amplifier (LNA) and the antenna; and means for selectively coupling capacitances to outputs of the main PA and the auxiliary PA, respectively.

* * * * *